(12) United States Patent
Cheng et al.

(10) Patent No.: US 9,892,931 B2
(45) Date of Patent: Feb. 13, 2018

(54) SEMICONDUCTOR MANUFACTURING APPARATUS AND METHOD THEREOF

(71) Applicant: TAIWAN SEMICONDUCTOR MANUFACTURING COMPANY LTD., Hsinchu (TW)

(72) Inventors: Nai-Han Cheng, Hsinchu County (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 17 days.

(21) Appl. No.: 14/052,973

(22) Filed: Oct. 14, 2013

(65) Prior Publication Data
US 2015/0104949 A1    Apr. 16, 2015

(51) Int. Cl.
C23C 14/35    (2006.01)
H01L 21/3065  (2006.01)
H01J 37/305   (2006.01)
H01J 37/317   (2006.01)

(52) U.S. Cl.
CPC ...... *H01L 21/3065* (2013.01); *H01J 37/3056* (2013.01); *H01J 37/317* (2013.01); *H01J 37/3172* (2013.01)

(58) Field of Classification Search
CPC combination set(s) only.
See application file for complete search history.

(56) References Cited

U.S. PATENT DOCUMENTS

| 4,825,087 A | * | 4/1989 | Renau et al. ............... 250/492.2 |
| 5,757,018 A | * | 5/1998 | MacK et al. ............. 250/492.21 |
| 6,362,490 B1 | * | 3/2002 | Tomita et al. ........... 250/492.21 |
| 6,452,197 B1 | * | 9/2002 | Ito ............................ 250/492.21 |
| 8,239,950 B1 |   | 8/2012 | Huang et al. |
| 2006/0113490 A1 | * | 6/2006 | Matsushita ......... H01J 37/3171 |
|   |   |   | 250/492.21 |

FOREIGN PATENT DOCUMENTS

| CN | 101141243 | 3/2008 |
| CN | 101582887 | 11/2009 |
| TW | 201327222 | 7/2013 |

OTHER PUBLICATIONS

Office Action and Search Report dated Aug. 12, 2015 from the Taiwan counterpart application 103122210.
English abstract translation of the Office Action and Search Report dated Aug. 12, 2015 from the Taiwan counterpart application 103122210, CN 101141243A, CN101582887, TW201327222.

* cited by examiner

*Primary Examiner* — Jason Berman
(74) *Attorney, Agent, or Firm* — WPAT, P.C., Intellectual Property Attorneys; Anthony King

(57) ABSTRACT

In some embodiments of the present disclosure, an apparatus includes an ionizer. The ionizer is configured to dispatch a reactive ion on a surface. The apparatus also has an implanter and the implanter has an outlet releasing an accelerated charged particle on the surface.

20 Claims, 11 Drawing Sheets

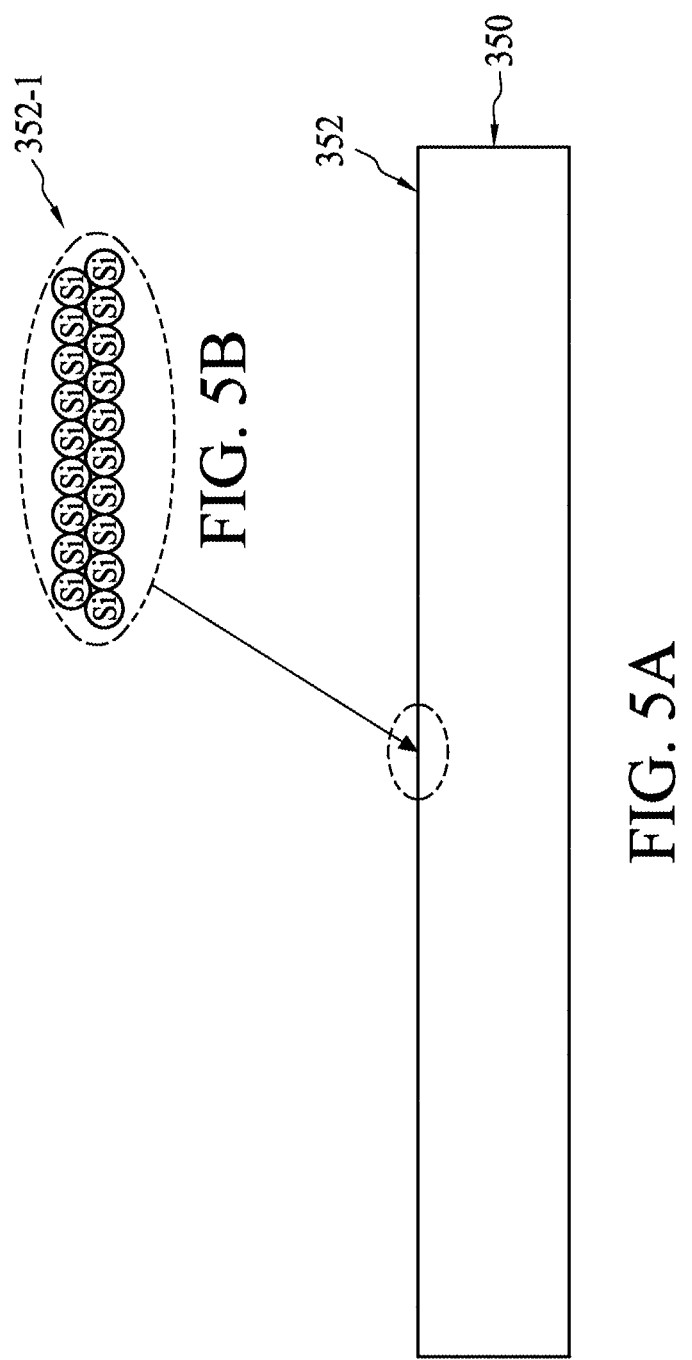

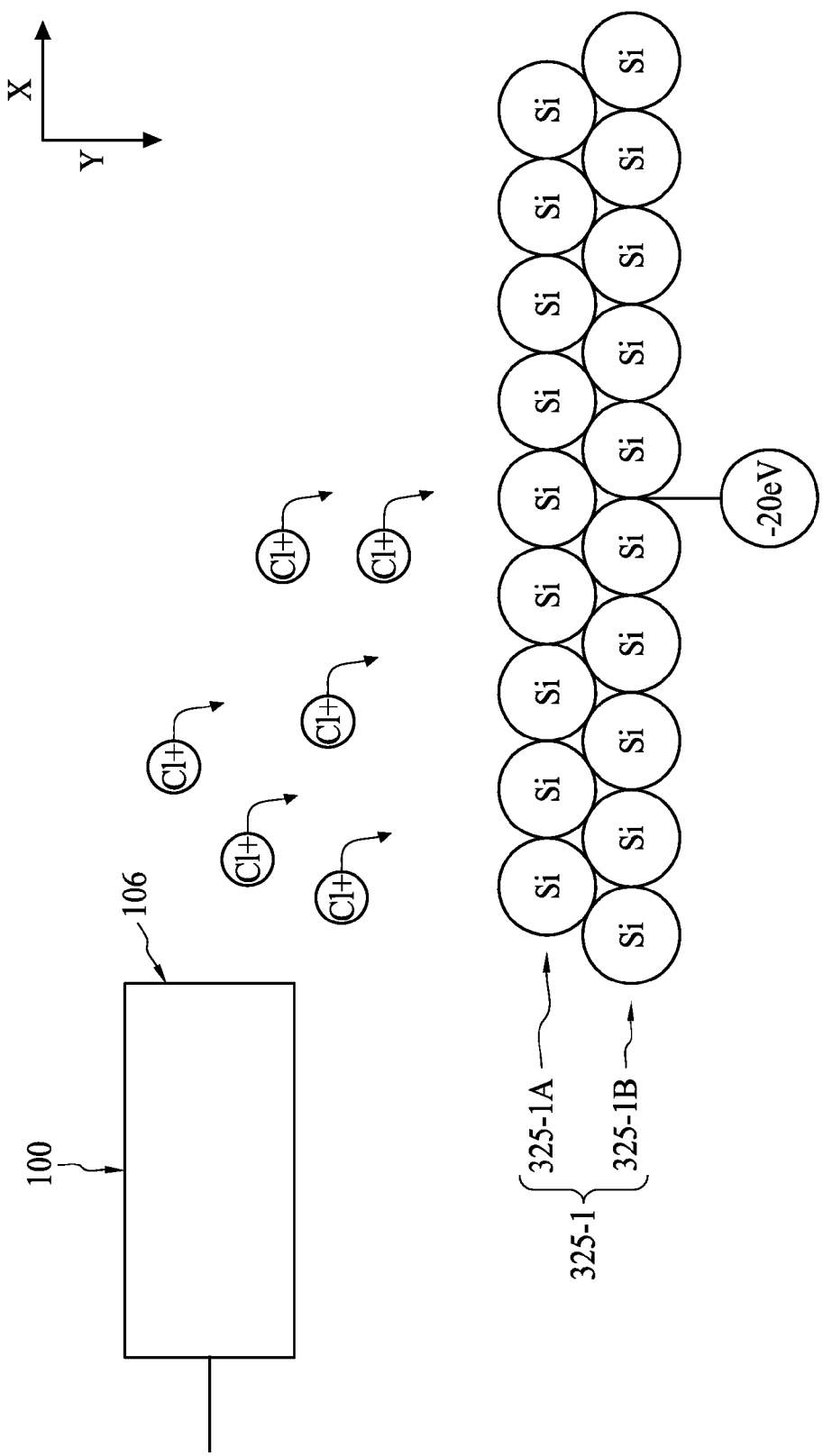

SEMICONDUCTOR MANUFACTURING APPARATUS AND METHOD THEREOF

FIELD

The present disclosure relates to a semiconductor manufacturing apparatus and a method thereof.

BACKGROUND

As the geometry of semiconductor devices shrinks, accuracy of pattern definition for critical dimensions, such as gate line width, trench depth or contact diameter become a challenging topic. For pattern definition, in addition to photolithography, etch is one of the important operations needs to be addressed.

Etch is used to sculpture a film to form a desired pattern and various types of etch processes are adopted accordingly. A reactive ion etch (RIE) is a type widely introduced in the field, especially in a directional patterning process. However, draw backs such as loading effect and selectivity cause undesired deviation and poor uniformity. Defects like film residues or corner rounding formed after the etch process impact the performance of a product yield or even the reliability. Thus, a high selectivity and pattern insensitive etch is required in order to manufacture an integrated circuit.

BRIEF DESCRIPTION OF THE DRAWINGS

Aspects of the present disclosure are described with reference to the accompanying figures. It is emphasized that, in accordance with the standard practice in the industry, various features are not drawn to scale. In fact, the dimensions of the various features may be arbitrarily increased or reduced for clarity of discussion.

FIG. 5A is substrate in accordance with some embodiments of the present disclosure.

FIG. 5B is a portion of the substrate in FIG. 5A in accordance with some embodiments of the present disclosure.

FIG. 5C illustrates an operation of iALE in accordance with some embodiments of the present disclosure.

DETAILED DESCRIPTION OF THE INVENTION

The making and using of various embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

In some embodiments of the present disclosure, an apparatus is designed to conduct a selective surface etch. In some embodiments, the apparatus is designed to conduct an atomic layer etch (ALE) with high selectivity. The apparatus treats a compound on a top surface of a wafer with a low energy charged particle in order to avoid damage on an area not to be treated. In some embodiments, the low energy is controlled to be within a predetermined range having a small range. In some embodiments, the charged particle is generated by an ion implanter.

In some embodiments of the present disclosure, an etchant is generated by an ionizer instead of a plasma generator in order to conduct a high-selective etch operation. The etchant is cooperating with an ion beam, which possesses a convergent energy distribution to remove target atoms.

In some embodiments, a method of removing an atom from a top surface of a substrate is accomplished by an implant atomic layer etch (iALE). The iALE includes operations that are implemented to selectively remove an atom (or atoms) from the top surface of a substrate. One operation is to form a compound of the atom of the top surface with an ionized etchant. One operation is to sputter the top surface with a charged particle having a predetermined energy that is smaller than the bonding energy between the substrate and the atom.

Figure 1:
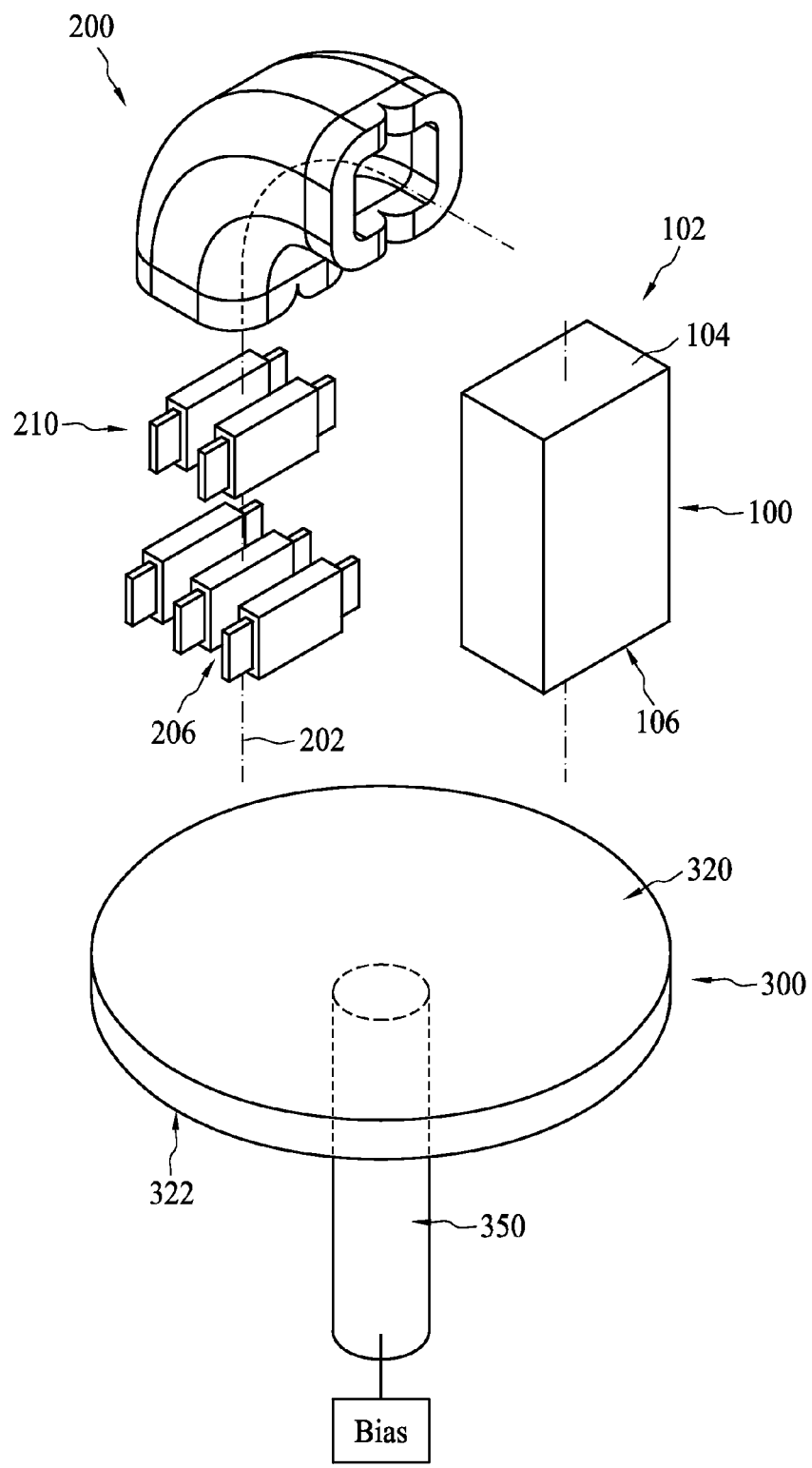
FIG. 1 is an apparatus designed to conduct iALE, in accordance with some embodiments of the present disclosure.

FIG. 1 is an apparatus 10 according to some embodiments of the present disclosure. The apparatus 10 has an ionizer 100 and a guide 210 of an implanter 200. The ionizer 100 has an axial direction 102 and the guide 210 has an axial direction 202. The axial direction 102 is substantially parallel to the axial direction 202. In some embodiments, the axial direction 102 is substantially perpendicular to the axial direction 202. In some embodiments, there is an angle between the axial direction 102 and the axial direction 202. The angle is greater than zero and smaller than 90 degrees. Other arrangements of relative positions between the axial direction 102 and the axial direction 202 are within the scope of the present disclosure.

The ionizer 100 has an entrance 104 and an exit 106. Compared to the entrance 103, the exit 106 is closer to the guide 210 of the implanter 200. The entrance 104 is used as an inlet of a gas. In some embodiments, an insert gas such as Ar is introduced into the ionizer 100 as a bombardment agent to dissociate other gases in the ionizer 100. For example, an etchant gas such as chlorine or fluorine based gas is introduced into the ionizer 100 with the inert gas simultaneously. The insert gas is accelerated in the ionizer 100 and ionizes the etchant gas therein. In some embodiments, the etchant gas is $Cl_2$ or $F_2$. The gas is guided into the ionizer 100 and ionized to generate reactive ions or etchants. The reactive ions or etchants are dispatched from the exit 106 of the ionizer 100 and designed to fall on a surface 320.

The implanter 200 is used to accelerate a charged particle. In some embodiments, the implanter 200 is an ion implanter. The charged particle carries a specified energy and is released from an outlet 206 of the implanter 200. In some embodiments, the charged particle is derived from a gas and the gas is dissociated in the implanter 200. In some embodiments, the implanter 200 includes magnetic coils to accelerate the charged particle. The charged particle released from the implanter 200 is designed to travel to the surface 320.

In some embodiments as in FIG. 1, the surface 320 is a top surface of a stage 300. In some embodiments, the surface 320 is configured to receive a work piece. The work piece, such as a semiconductor wafer can be placed on the surface 320. The dimension of the surface 320 is designed to accommodate different size of semiconductor wafer. In some embodiments, the surface 320 accommodates a six, eight, twelve, or eighteen inches semiconductor wafer. The bottom surface 322 of the stage 300 is connected to a shaft 350. The shaft 350 supports the stage 300. The stage 300 is coupled with a bias source as in FIG. 1 through shaft 350. The work piece disposed on surface 320 is induced to pull ions released from the ionizer 100.

Distribution of the reactive ions and charged particles is controlled within a predetermined uniformity. In some embodiments, the shaft 350 is designed to spin in order to rotate the stage 300, so as the work piece disposed thereon is spin to receive an evenly distributed reactive ions and charged particles. In some embodiments, the rotation speed of the stage 300 is up to about 1000 rpm. In some embodiments, the rotation speed of the stage 300 is between about 2000 rpm and about 7000 rpm. In some embodiments, the rotation speed of the stage 300 is between about 3000 rpm and about 6000 rpm. In some embodiments, either the ionizer 100 or the implanter 200 is changing position periodically during dispatch of the ions. In some embodiments, either the ionizer 100 or the implanter 200 is changing position periodically during release of the charged particle.

Figure 2:
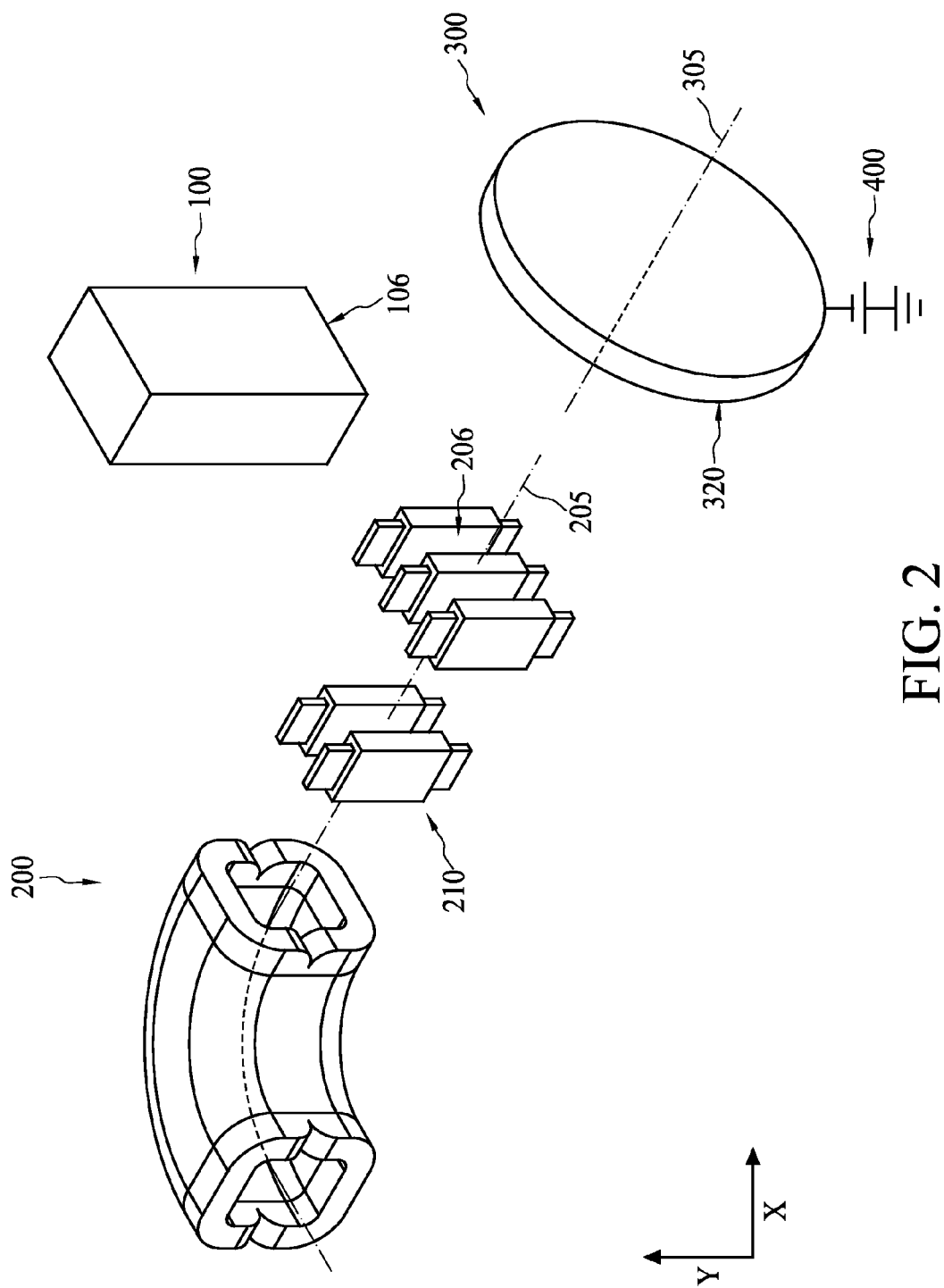
FIG. 2 is an apparatus designed to conduct iALE with a different ionizer arrangement compared to FIG. 1, in accordance with some embodiments of the present disclosure.

As in FIG. 2, the ionizer 100 is arranged perpendicular to the guide 210 of the implanter 200. In some embodiments as reference with FIG. 2, the stage 300 has a surface 320 facing the outlet 206 of the implanter 200. The plane normal 305 of the surface 320 is parallel to the X-direction and the axial direction 205 of the guide 210. In some embodiments, the plane normal 305 is not parallel to the axial direction 205. An angle between the plane normal 305 and the axial direction 205 is not equal to zero. In some embodiments, the angle between the plane normal 305 and the axial direction 205 is between about 2 degrees to about 20 degrees.

A side wall of the stage 300 is coupled to a bias generator 400. The bias generator 400 applies a bias on the stage 300 so as to form an electric field on the surface 320. The electric field attracts ions dispatched from the ionizer 100. In some embodiments, ions dispatched from the exit 106 travelling along the Y-direction are routed to travel along the X-direction by the electric filed. In some embodiments, the stage 300 is an e-chuck. The stage 300 has a ceramic coating on the surface 320. In some embodiments, the bias generator 400 is coupled to a surface opposite to the surface 320. In some embodiments, the ionizer 100 is a plasma flood gun (PFG).

Figure 3:
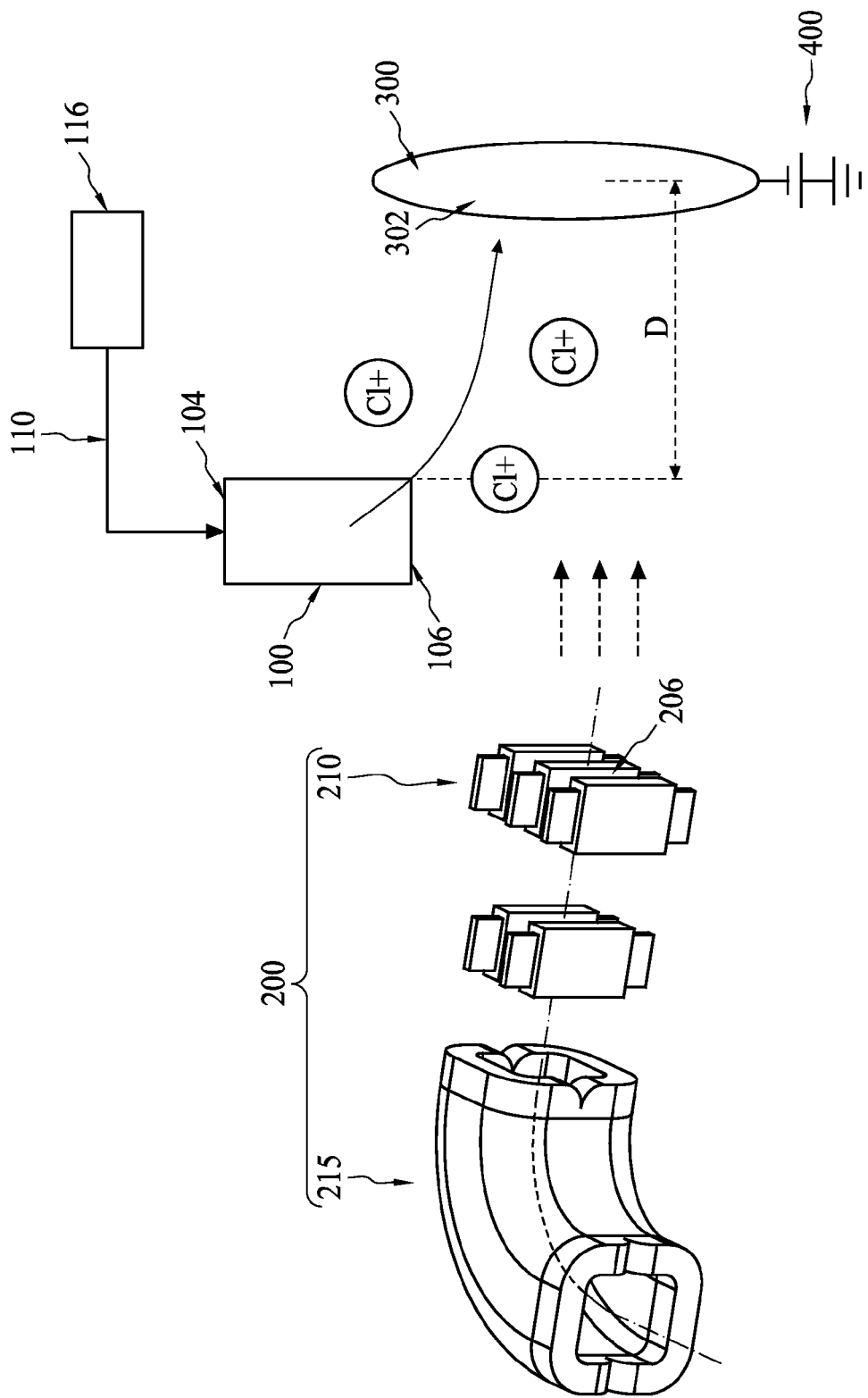
FIG. 3 is an apparatus designed to conduct iALE with PFG as an ionizer, in accordance with some embodiments of the present disclosure.

FIG. 3 is an apparatus used to conduct iALE operation. The apparatus is designed to treat a wafer's top surface at atomic scale. In some embodiments, the atoms on the top surface is removed by layer. The apparatus includes an ionizer 100. The ionizer 100 is a PFG. On one end of the ionizer 100 is an entrance 104 and the entrance 104 is connected to a gas tube 110. The gas tube 110 is connected to a gas bottle 116. In some embodiments, there is a mass flow controller (MFC) and a control valve disposed between the gas bottle 116 and the ionizer 100. The gas bottle 116 accommodates gas such as $Cl_2$, $F_2$ chlorine based gas, or fluorine based gas. Other reactant gas are within the scope of the present disclosure. In the present embodiments, $Cl_2$ is used as an example.

The $Cl_2$ gas is pressurized into the ionizer 100 and ionized. The $Cl_2$ gas is dissociated in an arc chamber of the ionizer 100. Some positively charged chlorine ions, such as $Cl^+$ ions are generated. The flux of $Cl^+$ ions are guided and dispatched from the exit 106 of the ionizer 100.

A stage 300 is disposed close to the exit 106 of the ionizer 100. The top surface 302 of the stage 300 is positioned away from the exit 106 with a gap D. In some embodiments, the top surface 302 is designed to receive a semiconductor wafer. The gap D is defined as the shortest distance between the exit 106 of the ionizer 100 to the top surface 302 of the stage 300. In some embodiments, the gap D is between about 10 cm and 35 cm. In some embodiments, the gap D is between about 10 cm and 30 cm. In some embodiments, the gap D is between about 15 cm and 25 cm. In some embodiments, the gap D is between about 18 cm and 23 cm. In some embodiments, the gap D is between about 18 cm and 22 cm. In some embodiments, the gap D is about 20 cm. In some embodiments, the gap D is smaller than 20 cm.

The stage 300 is coupled to a bias generator 400. The bias generator 400 is configured to provide a DC bias on the top surface 302. In some embodiments, the DC bias is negative so as to attract positive ions to attach on the top surface 302. In some embodiments, the DC bias is between about −10 eV and −30 eV. In some embodiments, the DC bias is between about −15 eV and −25 eV. In some embodiments, the DC bias is between about −18 eV and −23 eV. In some embodiments, the DC bias is about −20 eV. In some embodiments, the DC bias is smaller than −20 eV.

Implanter 200 is located at a predetermined distance from the top surface 302. In some embodiments, the outlet 206 of the implanter 200 is located about between 35 cm and 45 cm from the top surface 302. In some embodiments, the outlet 206 of the implanter 200 is located about between 40 cm and 60 cm from the top surface 302. The implanter 200 is configured to emit an ion beam from the outlet 206 toward the surface 302. The ion beam includes a stream of charged particles and the charged particles are accelerated by the implanter 200. As in FIG. 3, the implanter 200 has a filter 215 to allow a specified charged particle entering into the guide 210. In some embodiments, the filter 215 does not exist if only selected species are supplied into the implanter. In some embodiments, some species such as Ar, N, and H is used as a source of the charged particles, which are to be emitted onto the top surface 302.

In some embodiments, the implanter 200 is used to accelerate the charged particles to a certain electron voltages. In some embodiments, the implanter 200 emits an Ar beam with an electron voltage ranges about 50 eV to about 1 MeV. In some embodiments, the Ar beam is accelerated with an electron voltage around 200 eV.

Figure 4:
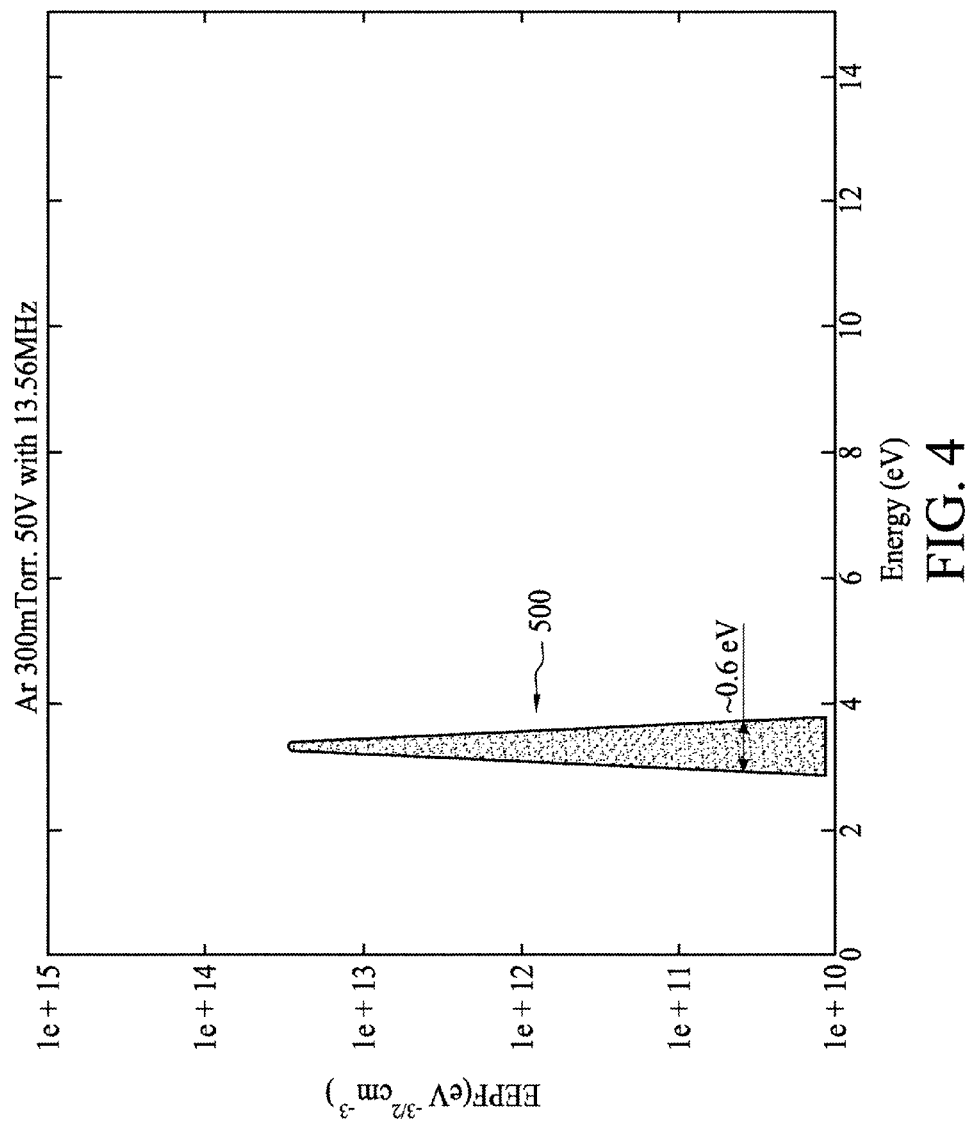
FIG. 4 is an energy distribution of several charged particles emitted from the implanter in FIG. 3 in accordance with some embodiments of the present disclosure.

Each charged particle emitted from the outlet 206 possesses an energy. In some embodiments, an energy distribution of the charged particles included in the emitted ion beam is a normal distribution. The energy distribution is controlled within a predetermined range. In some embodiments, the energy distribution has a small range. FIG. 4 is an energy distribution of an ion beam generated by the implanter 200 according to some embodiments of present disclosure. The ion beam is an Ar beam, which is accelerated to 200 eV. The X-axis is the energy of a charged particle and is measured in eV; Y axis is ions sputtering yield. The peak 500 is an energy distribution of the charged particles in the Ar ion beam. A range of the peak 500 is defined as the bottom width of the peak 500. The lowest energy of the peak 500 is about 3.2 eV and the highest energy is about 3.8 eV. The range of the Ar ion beam is about 0.6 eV. In some other embodiments, the range of the energy distribution controlled by the implanter 200 is smaller than about 4.0 eV.

In some embodiments, the aforementioned apparatus in the present disclosure are used to conduct a surface treatment method. In some embodiments, the surface treatment method includes removing an atom of a surface layer from a wafer substrate. In some embodiments, the wafer substrate is a silicon substrate. In some embodiments, the surface treatment method includes selectively removing an atom of a surface layer from the wafer substrate without breaking the bonding between the atom and the wafer substrate.

A substrate 350 is provided in FIG. 5A. The substrate 350 is composed of silicon atoms. The substrate 350 has a surface 352 and an enlarged view of a portion 352-1 of the surface 352 as illustrated in FIG. 5B. The substrate 350 includes multiple layers of silicon atoms and only two layers of atoms are exemplarily illustrated in FIG. 5B. The arrangement of the silicon atoms varies according to the design of the substrate. Various crystalline orientations such as (110), (100), and other arrangements are within the contemplated scope of the present disclosure. The portion 352-1 is used as an example to explain a surface treatment method according to some embodiments of the present disclosure.

FIG. 5C is the portion 352-1 and layer 352-1A is the top layer of the portion 352-1. The top layer 352-1A includes several silicon atoms. A layer 352-1B is the second layer, which is disposed under the top layer 352-1A. The atomic bond between silicon atoms is about 4.215 eV. That is, adjacent silicon atoms in the same or different layer are bound with an energy at about 4.215 eV. In some embodiments, the first layer 352-1A is designed to be removed by a surface treatment. The portion 352-1 is applied with a negative bias by coupling the substrate 350 as in FIG. 5A with a bias source. The output of the bias source is about −20 eV. An etchant, such as $Cl_2$ gas is ionized by the ionizer 100, which is disposed over the portion 352-1. A circle with an "$Cl^+$" is a positively charged chlorine ion of the ionized $Cl_2$ gas. The flux of ionized $Cl_2$ is dispatched from the exit 106 along the X direction. Because the ionized etchant, $Cl^+$, is positively charged, the negative biased portion 352-1 attracts the ionized etchant so as to change the direction of the ion flux to the Y direction.

Figure 6:
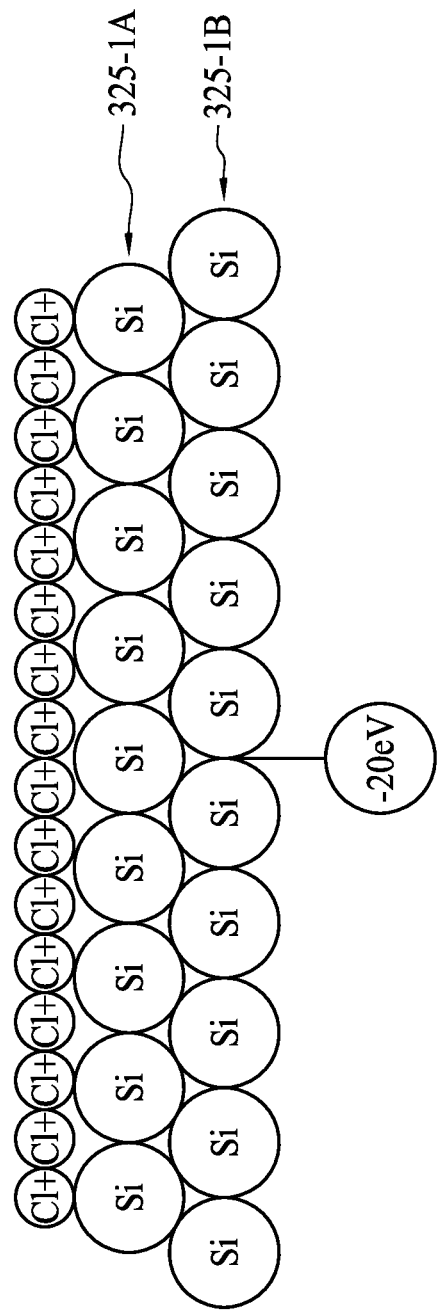
FIG. 6 illustrates attaching ionized etchants on a top layer of the substrate in FIG. 5B in accordance with some embodiments of the present disclosure.

The ionized etchants attach on the top layer 352-1A as in FIG. 6 and are bonded with silicon atoms of the top layer 352-1A to form a compound such as $Si_xCl_y$. In some embodiments, a ratio between y and x (i.e. y/x) is 1, 2, 3, or 4. In some embodiments, a ratio between y and x is not an integer. In some embodiments, the compounds includes at least two different types of composition stoichiometry, for example, an $SiCl_2$ and an $SiCl_3$. The compound formed with atoms and the ionized etchants changes the bonding energy between the top layer 352-1A and the second layer 352-1B. In some embodiments, the bonding energy between compound of the top layer 352-1A and atoms of the second layer 352-1B is smaller than the bonding energy between silicon atoms. Thus, there is no damage to atoms in the second layer 352-1B during removal of the $Si_xCl_y$ compound, which is transformed from the Si atoms of the top layer 352-1A and disposed on the second layer 352-1B.

Figure 7:
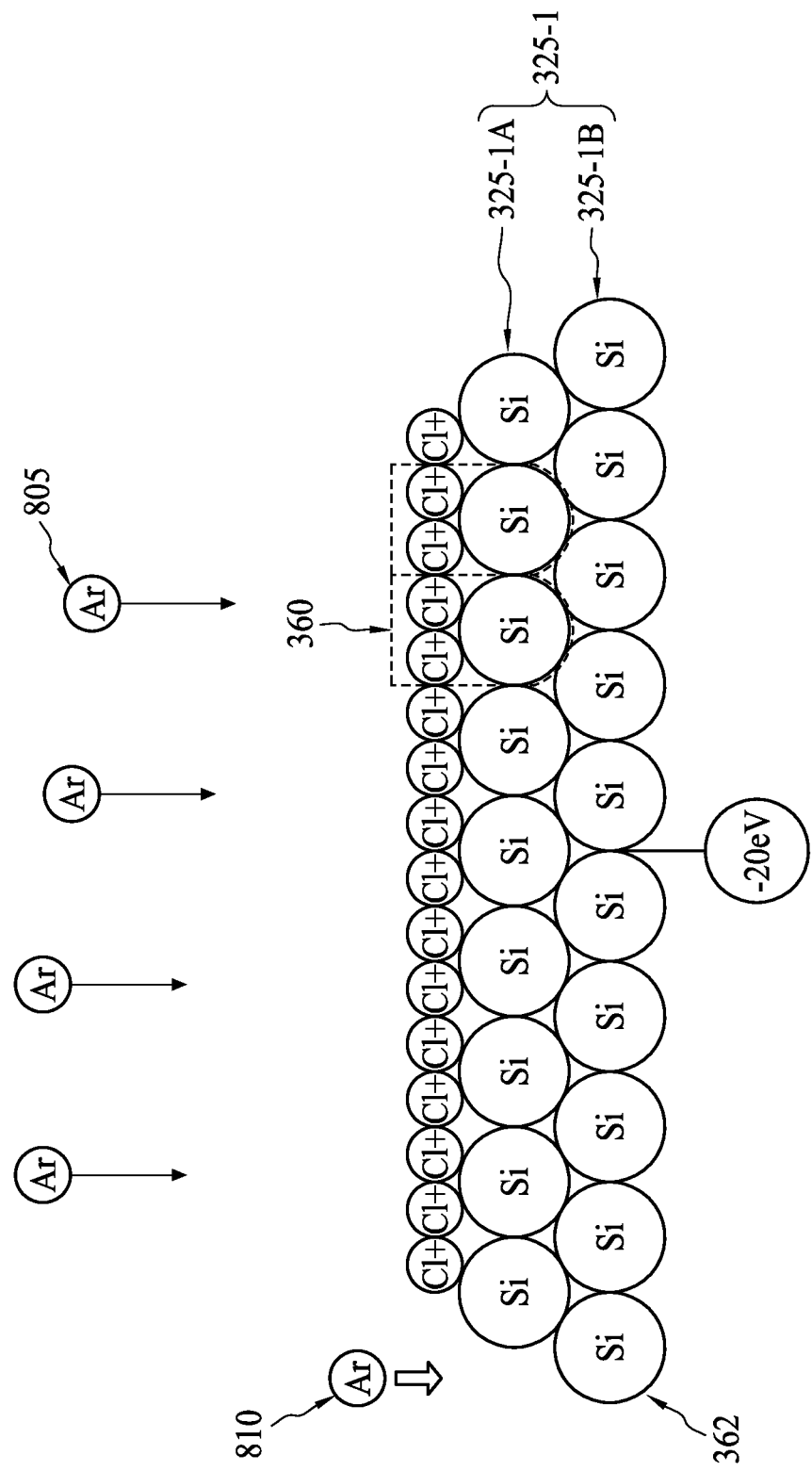
FIG. 7 illustrates sputtering $Si_xCl_y$ compound on a top layer as formed in FIG. 6 in accordance with some embodiments of the present disclosure.

In FIG. 7, an ion beam including charged particles is generated by any one of the aforementioned apparatus. The charged particles are emitted from an implanter. The implanter is selected from any implanter as illustrated in FIGS. 1 to 3. In certain embodiments as in FIG. 7, the charged particles include $Ar^+$. In some other embodiments, the charged particles include $H^+$, or $N^+$. Each charged particle has an energy smaller than the bonding energy between the atom of the second layer 352-1B and the atom of the top layer 352-1A. In some embodiments, each charged particle has an energy being greater than the bonding energy of a silicon and a chlorine and smaller than the bonding energy between adjacent silicon atoms. In some embodiments, each charged particle has an energy between about 3.393 eV and about 4.215 eV. In some embodiments, range of energy distribution of the charged particles is controlled to be smaller than 0.8 eV. In some embodiments, range of energy distribution of the charged particles is controlled to be smaller than 0.75 eV.

Figure 8:
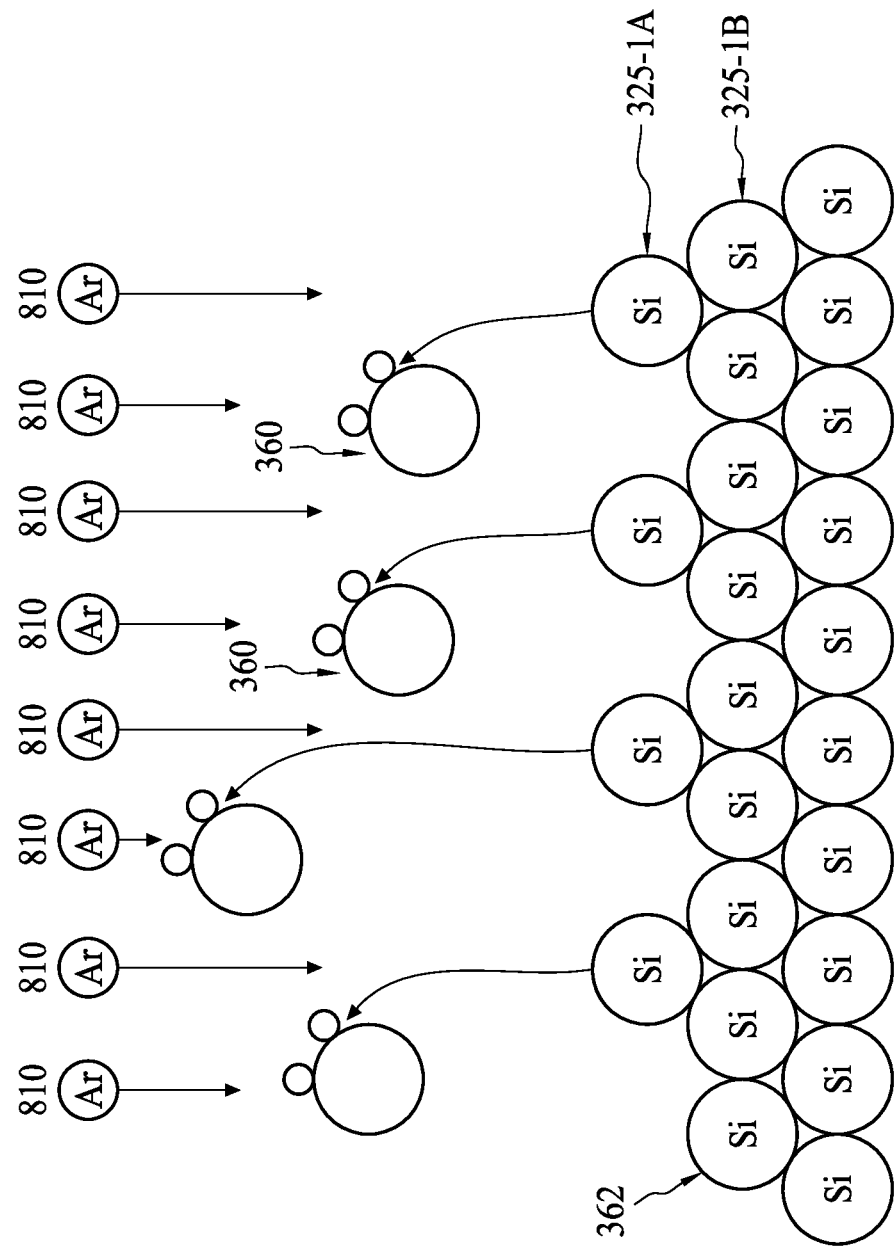
FIG. 8 illustrates removing $Si_xCl_y$ compound on a top layer in FIG. 7 in accordance with some embodiments of the present disclosure.

The charged particles are guided to sputter the substrate 352-1 and bombard the $Si_xCl_y$ compound 360 formed on the substrate 352-1. The force of bombardment is great enough to remove a $Si_xCl_y$ compound 360 from the second layer 352-1B but smaller than an energy to remove a silicon atom of the second layer 352-1B from the substrate 352-1. Referring to FIG. 7, an $Ar^+$ ion 805 is a charged particle with an energy of 4.0 eV released from an implanter. The $Ar^+$ ion 805 is directed to hit the top layer 352-1A of the substrate 325-1. More specifically as in FIG. 7, the $Ar^+$ ion 805 bombards a $SiCl_2$ compound 360. An $Ar^+$ ion 810 with an energy of 4.0 eV is directed to hit a silicon atom 362 of the second layer 352-1B. The $SiCl_2$ compound 360 is removed from the substrate 352-1 as in FIG. 8. In some embodiments, the unbound $SiCl_2$ compound 360 is carried away by a vacuum. The silicon atoms of the top layer 325-1A is removed with the removed $SiCl_2$ compound 360. Gradually, other silicon atoms of the top layer 325-1A are removed in an atomic scale manner.

However, because energy of the $Ar^+$ ion 810 is smaller than the bonding energy of silicon atom, which 4.125 eV, the $Ar^+$ ion 810 is not able to remove the silicon atom 362 from the second layer 352-1B. The silicon atom 362 of the second layer 352-1B is securely bound with adjacent atoms of the second layer 352-1B or layer underneath. Thus, only atoms of the top layer 352-1A is selectively removed and no damage occurs on the second layer 352-1B.

Figure 9A:
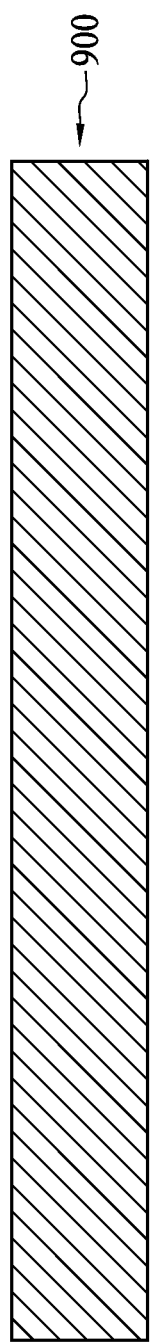
FIGS. 9A-9C illustrates forming a pattern structure by iALE in accordance with some embodiments of the present disclosure.

FIGS. 9A to 10C is a method including several operations to form a pattern with iALE. In FIG. 9A, a film 900 is provided. In some embodiments, the film 900 is a semiconductor film, such as a poly silicon or an amorphous silicon. In some embodiments, the film 900 is a dielectric film, such as a silicon oxide or silicon nitride. In some embodiments, the film 900 is a conductive film, such as a metal or alloy.

Figure 9B:
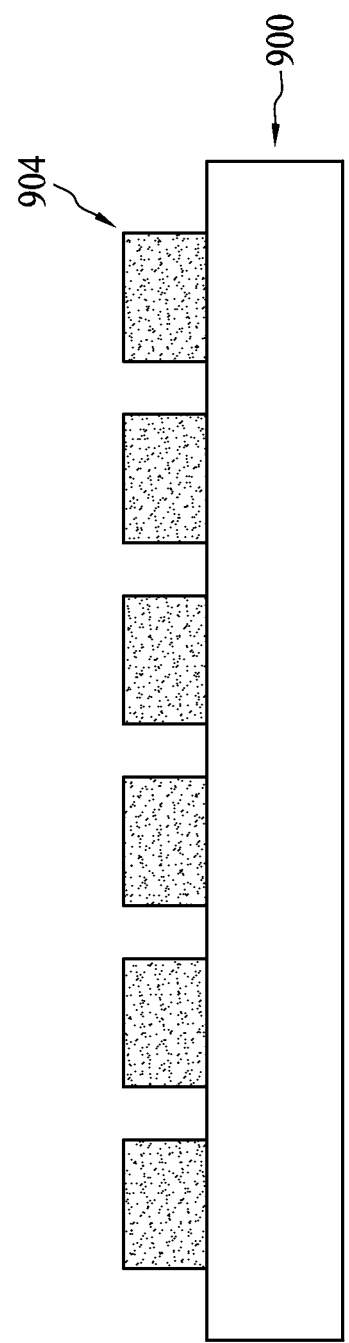
Figure 9C:
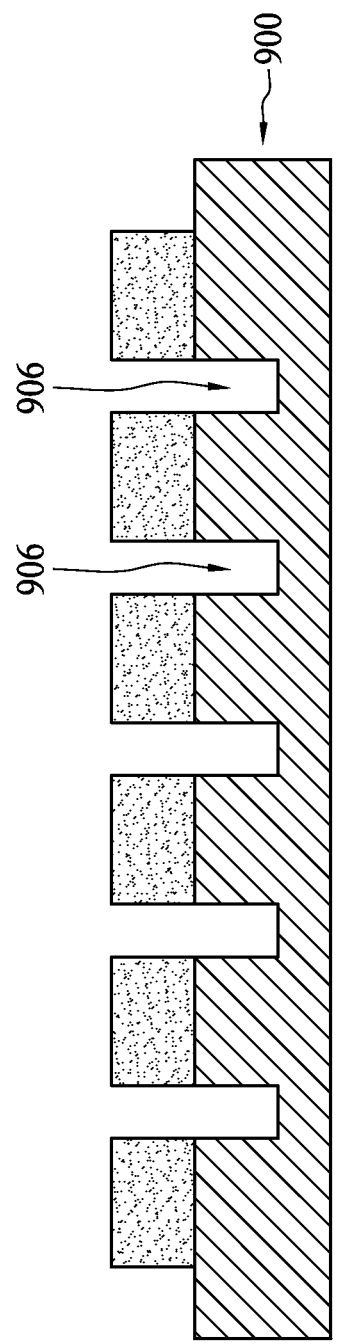

In FIG. 9B, a photo resist layer 904 is disposed on the film 900 to form a pattern. In FIG. 9C, an iALE is introduced to remove a portion of the film 900 with a high selectivity. The removal operation is conducted in an atomic scale manner. Several trenches 906 with a high aspect ratio are formed. In some embodiment, the aspect ratio is greater than 5. In some embodiment, the aspect ratio is greater than 6. In some embodiment, the aspect ratio is between 6 and 10.

In some embodiments of the present disclosure, an apparatus includes an ionizer. The ionizer is configured to dispatch a reactive ion on a surface. The apparatus also has an implanter and the implanter has an outlet releasing an accelerated charged particle on the surface.

In some embodiments of the present disclosure, an apparatus includes an ionizer and the ionizer is a PFG.

In some embodiments of the present disclosure, an apparatus includes an ionizer. The ionizer is configured to dispatch a reactive ion on a surface. The apparatus also has an implanter and the implanter has an outlet releasing an accelerated charged particle on the surface. The accelerated charged particle is positively charged.

In some embodiments of the present disclosure, an apparatus includes an ionizer. The ionizer is configured to dispatch a reactive ion on a surface. The apparatus also has an implanter and the implanter has an outlet releasing an accelerated charged particle on the surface. The reactive ion is dispatched from an exit of the ionizer, and a gap is between the exit and the surface In some embodiments of the present disclosure, an apparatus includes an ionizer. The ionizer is configured to dispatch a reactive ion on a surface. The apparatus also has an implanter and the implanter has an outlet releasing an accelerated charged particle on the surface. The accelerated charged particle has an energy within a predetermined range In some embodiments of the present disclosure, an apparatus includes an ionizer. The ionizer is configured to dispatch ions. The apparatus includes a stage having a surface and the stage is configured to be biased to attract ions dispatched from the ionizer toward the surface. The apparatus further has an implanter designed to emit an ion beam toward the surface.

In some embodiments of the present disclosure, an apparatus includes an ionizer. The ionizer is configured to dispatch ions. The apparatus includes a stage having a surface and the stage is coupled to a bias generator.

In some embodiments of the present disclosure, a method of treating an atom on a substrate includes an operation of ionizing an etchant and an operation of attaching the ionized etchant on the atom. The method also includes an operation of bonding the atom with the etchant to from a compound. The method further includes sputtering the substrate with a charged particle having an energy smaller than the bonding energy between the substrate and the atom.

In some embodiments of the present disclosure, a method of treating an atom on a substrate includes an operation of ionizing an etchant and the ionized etchant is a positively charged. The method includes an operation of attaching the ionized etchant on the atom. The method also includes an operation of bonding the atom with the etchant to from a compound. The method further includes sputtering the substrate with a charged particle having an energy smaller than the bonding energy between the substrate and the atom.

In some embodiments of the present disclosure, a method of treating an atom on a substrate includes an operation of ionizing an etchant and the ionized etchant is a positively charged. The method includes an operation of attaching the ionized etchant on the atom. The method also includes an operation of bonding the atom with the etchant to from a compound. The method further includes sputtering the substrate with a charged particle and an operation of applying a bias on the wafer.

In some embodiments of the present disclosure, a method of treating an atom on a substrate includes an operation of sputtering the substrate with a charged particle. The charged particle has an energy greater than a bonding energy between the atom and the etchant.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A surface etching apparatus, comprising:
an ionizer including an exit and configured to dispatch a reactive ion from the exit to a surface in a first direction; and
an implanter having an outlet releasing an accelerated charged particle on the surface in the first direction, and a plurality of guides disposed at the outlet and elongated along a second direction orthogonal to the first direction to allow the accelerated charged particle passing between two of the plurality of guides and along the first direction,
wherein an atom disposed over the surface and attached with the reactive ion is removable by the accelerated charged particle, and a distance between the exit and the surface is less than about 35 cm.

2. The surface etching apparatus of claim 1, wherein the ionizer is a plasma flood gun (PFG).

3. The surface etching apparatus of claim 1, wherein the reactive ion is a positive charge.

4. The surface etching apparatus of claim 1, wherein the distance is equal or smaller than about 20 centimeters.

5. The surface etching apparatus of claim 1, wherein the surface is designed to receive a semiconductor wafer.

6. The surface etching apparatus of claim 1, wherein the accelerated charged particle has an energy within a predetermined range.

7. The surface etching apparatus of claim 6, wherein the energy is between about 3.3 eV and 4.2 eV.

8. A surface etching apparatus, comprising:
an ionizer including an exit and configured to dispatch positively charged ions from the exit in a first direction;
a stage having a surface, wherein the stage is configured to be biased to attract the positively charged ions dispatched from the ionizer in the first direction toward the surface; and
an implanter including an outlet designed to emit an ion beam toward the surface in the first direction, and a plurality of guides disposed at the outlet,
wherein the ion beam is configured to remove the positively charged ions bonded with atoms disposed over the surface of the stage from the surface, and the plurality of guides are elongated along a second direction orthogonal to the first direction to allow the ion beam passing between two of the plurality of guides and along the first direction, and a distance between the exit and the surface is less than about 35 cm.

9. The surface etching apparatus of claim 8, wherein the stage is coupled to a bias generator.

10. The surface etching apparatus of claim 8, wherein the surface having a plane normal with an angle with the emitted ion beam.

11. The surface etching apparatus of claim 10, wherein the angle is between about 0 to 15 degrees.

12. The surface etching apparatus of claim 8, further comprising a gas source connected to the ionizer.

13. The surface etching apparatus of claim 8, wherein the ionizer comprises an arc chamber.

14. The surface etching apparatus of claim 1, wherein the implanter is located at a predetermined distance from the surface.

15. The surface etching apparatus of claim 1, wherein the surface includes an electric field for attracting the reactive ion from the ionizer.

16. A surface etching apparatus, comprising:
a stage including a surface;
an ionizer including an exit and configured to dispatch an ionized etchant from the exit in a first direction; and
an implanter including an outlet configured to dispatch an accelerated charged particle in a second direction towards the surface, and a plurality of guides disposed at the outlet, wherein the first direction is substantially parallel to the surface and is substantially orthogonal to the second direction, the ionized etchant is attractable by the stage to travel along the second direction towards the surface, the atom attached with the ionized etchant is removable from the surface by the accelerated charged particle, and the plurality of guides are elongated along the first direction to allow the accelerated charged particle passing between two of the plurality of guides and along the second direction, and a distance between the exit and the surface is less than about 35 cm.

17. The surface etching apparatus of claim 16, wherein the surface is rotatable in a predetermined rotational speed.

18. The surface etching apparatus of claim 16, wherein the surface includes silicon.

19. The surface etching apparatus of claim 1, wherein the plurality of guides are disposed adjacent to the outlet of the implanter.

20. The surface etching apparatus of claim 17, wherein the predetermined rotational speed is up to about 1000 rpm.

* * * * *